US00RE43223E

(19) United States
(12) Reissued Patent
Stimak et al.

(10) Patent Number: US RE43,223 E
(45) Date of Reissued Patent: Mar. 6, 2012

(54) DYNAMIC MEMORY MANAGEMENT

(75) Inventors: Marc Stimak, Austin, TX (US); Terry C. Brown, Austin, TX (US); Mike Minnick, Austin, TX (US)

(73) Assignee: Frankfurt GmbH, LLC, Wilmington, DE (US)

(21) Appl. No.: 12/108,221

(22) Filed: Apr. 23, 2008 (Under 37 CFR 1.47)

Related U.S. Patent Documents

Reissue of:
(64) Patent No.: 7,035,155
Issued: Apr. 25, 2006
Appl. No.: 10/256,265
Filed: Sep. 26, 2002

(51) Int. Cl.
*G11C 11/406* (2006.01)
*G11C 11/4076* (2006.01)
*G11C 7/22* (2006.01)
*G11C 8/18* (2006.01)
*G06F 1/04* (2006.01)

(52) U.S. Cl. ..... 365/222; 365/230.03; 365/227; 365/233.1; 713/322; 713/601; 711/106

(58) Field of Classification Search ..... 365/222, 365/226, 227, 228, 229, 230.03, 233.1, 233.5; 713/320, 322, 323, 601; 711/106, 167
See application file for complete search history.

(56) References Cited

U.S. PATENT DOCUMENTS 5,590,082 A 12/1996 Abe
5,627,791 A 5/1997 Wright et al.
5,881,016 A 3/1999 Kenkare et al.
5,898,290 A 4/1999 Beard et al.
5,918,242 A * 6/1999 Sarma et al. ..... 711/5
6,073,223 A * 6/2000 McAllister et al. ..... 711/167
6,208,577 B1 * 3/2001 Mullarkey ..... 365/222
6,216,233 B1 4/2001 Baweja
6,252,830 B1 6/2001 Hsu
6,272,588 B1 8/2001 Johnston et al.
6,317,657 B1 * 11/2001 George ..... 700/286
6,658,544 B2 12/2003 Gray
6,763,443 B1 7/2004 Clark et al.
2002/0026543 A1 * 2/2002 Tojima et al. ..... 710/22
2003/0081483 A1 * 5/2003 De Paor et al. ..... 365/222

OTHER PUBLICATIONS

Sklavos, N. and Koufopavlou, O., "Low-Power Implementation of an Encryption/Decryption System with Asynchronous Techniques," Proceedings of the First Conf. on Microelectronics, Microsystems and Nanotechnology (MMN 2000), Athens, Greec, Nov. 20-22, 2002.
Office Action for U.S. Appl. No. 10/256,265 mailed Apr. 23, 2004.
Final Office Action for U.S. Appl. No. 10/256,265 mailed Jan. 11, 2005.
Office Action for U.S. Appl. No. 10/256,265 mailed Sep. 6, 2005.
Notice of Allowance for U.S. Appl. No. 10/256,265 mailed Nov. 29, 2005.

* cited by examiner

*Primary Examiner* — J. H. Hur
(74) *Attorney, Agent, or Firm* — Schwabe, Williamson & Wyatt, P.C.

(57) ABSTRACT

In a method, system and apparatus for management of dynamic memory in battery-powered devices, information is stored in dynamic memory, such as SDRAM chips. Chip partitioning minimizes the number of chips requiring power, minimum refresh rates reduce the power needed to maintain information, and a threshold for determining when to power down a battery powered device are used to maximize battery life.

23 Claims, 2 Drawing Sheets

DYNAMIC MEMORY MANAGEMENT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to the field of dynamic memory management. In particular, the present invention relates to hardware and software methods to manage the use of dynamic memory in devices requiring low power consumption, such as battery-powered devices.

2. Description of Related Art

Battery-powered electronic devices such as digital music players and digital cameras typically require significant information storage capacity, and must maintain information during periods of time when the device is in a powered down state. Current battery-powered electronic devices address these needs with various forms of non-volatile memory, such as solid-state flash memory, hard drives, floppy disks, etc. These memory systems however, typically are either very expensive or require too much power to make them viable for inexpensive battery-powered devices. For example, hard drives and floppy disks are inexpensive on a cost per megabyte basis, but are both bulky and require large amounts of power. Flash memory is expensive, but is compact and reliable.

Volatile memory has not been considered a viable solution because of the high power consumption rate typically associated with the need for constant power to maintain information reliably.

In an effort to improve storage capacity in battery-powered devices, it is therefore desirable to provide a memory system that has a low power consumption rate and a high information storage capacity. It is furthermore desirable to have a system with a high degree of information reliability. It is furthermore desirable to have an inexpensive system for storing information reliably.

SUMMARY OF THE INVENTION

The present invention provides hardware and software solutions to enable volatile memory to replace non-volatile memory in battery-powered devices.

In a preferred embodiment, the present invention provides a method for reducing the supply voltage and reducing the frequency of accesses to volatile memory stored in battery-powered devices. Further, the present invention provides a method for partitioning volatile memory chips to reduce the number of volatile memory chips needed to store a given set of information. Further, the present invention provides a method for determining a minimal refresh rate to reliably maintain information on volatile memory chips during accesses.

In one broad respect, the present invention is directed to a device comprising a dynamic memory and a clock signal, wherein the dynamic memory is adapted to store information, the dynamic memory must be refreshed to avoid loss of its stored information, and the dynamic memory is adapted to undergo read, write, and refresh cycles responsively to the clock signal, and the clock signal need not be periodic, such that the clock signal is supplied to the dynamic memory only when needed for a read, write, or refresh of the dynamic memory.

In another broad respect, the present invention is directed to a device comprising a plurality of dynamic memories, wherein each dynamic memory must be refreshed to avoid loss of its stored information, and wherein each dynamic memory is adapted to be used in one of at least two device modes, the device modes being (a) power up mode and (b) power down mode; and a clock signal; wherein each dynamic memory is adapted to undergo read, write, and refresh cycles responsively to the clock signal; wherein a dynamic memory undergoing a read or write cycle is in an active mode; wherein information is allocated among the dynamic memories to create a tendency for related information to be stored on a single dynamic memory to the extent possible; and whereby other dynamic memories can be used in an active mode while a dynamic memory is in an inactive mode.

In another broad respect, the present invention is directed to a device comprising a processor, a dynamic memory adapted to store information, and a program adapted to be executed by the processor to determine the minimum refresh rate for the dynamic memory, wherein the dynamic memory must be refreshed at at least the determined minimum refresh rate to avoid loss of stored information. In one embodiment, the device further comprises a clock signal, wherein the dynamic memory is adapted to undergo a refresh cycle responsively to the clock signal; wherein the dynamic memory is adapted to be used in one of at least two device modes, the at least two device modes comprising (a) power up mode and (b) power down mode; and wherein, when the dynamic memory is used in a device power down mode, the rate of the clock signal causes the dynamic memory to be refreshed at approximately a determined minimum refresh rate. In another embodiment, a determined minimum refresh rate corresponds to a normal operating temperature range. In other embodiments, when the dynamic memory is used in a device power up mode, the actuation rate of the clock signal causes the dynamic memory to be refreshed at approximately the a determined minimum refresh rate; wherein a clock signal causing the dynamic memory to undergo a read cycle prevents occurrence of a refresh cycle; and wherein a clock signal causing the dynamic memory to undergo a write cycle prevents occurrence of a refresh cycle.

In another broad respect, the present invention is directed to a device comprising a processor, a plurality of volatile memories adapted to store information and that must be refreshed at at least a minimum refresh rate to avoid loss of its stored information; a clock signal, wherein each dynamic memory is adapted to undergo read, write, or refresh cycles responsively to the receiving clock signal, wherein the clock signal need not be periodic, such that the clock signal is supplied to the dynamic memory only when needed for a read, write, or refresh of the dynamic memory; and a program adapted to be executed by the processor to determine the minimum refresh rate for each dynamic memory; wherein the plurality of dynamic memories are adapted to be used in one of at least two device modes, the device modes comprising (a) power up mode and (b) power down mode; wherein a volatile memory undergoing a read or write cycle is being used in an active mode; wherein the processor allocates storage of information among the volatile memories to create a tendency for related information to be stored on a particular dynamic memory to the extent possible, whereby other volatile memories can be used an inactive mode while the particular dynamic memory is used in an active mode. In some embodiments, the device further comprises a computing device including a secondary memory, wherein each dynamic memory is adapted to be in communication with the secondary memory, such that the stored information of each dynamic memory can be backed up on the secondary memory; and such that backed up information on the secondary memory can be restored from the secondary memory. In one embodiment, a constant voltage is supplied to each dynamic memory. In other embodiments, the device further comprises a refresh circuit that generates a square wave; and when the dynamic memory is in an inactive mode, the clock signal is responsive to the refresh circuit's square wave. In another embodiment, the device further comprises resistor pull-ups and resister pull-downs, wherein the resistor pull-ups and resistor pull-downs are configured to enable the dynamic memory to undergo refresh cycles while the remainder of the device is in a powered down mode. In another embodiment the device further comprises a first battery and a second battery, wherein the first battery is adapted to provide sufficient power to enable each of the plurality of volatile memories to undergo refresh cycles and the second battery is adapted to provide sufficient power to enable each of the plurality of volatile memories to undergo refresh cycles; and wherein loss of the stored information of each of the plurality of volatile memories is avoided so long as at least one of the batteries is sufficiently charged and engaged. In alternative embodiments, the device further comprises a battery adapted to provide, when sufficiently charged and engaged, sufficient power to enable each of the plurality of volatile memories to undergo refresh cycles; wherein the battery is adapted to be recharged to be at least sufficiently charged; and whereby loss of the stored information of each of the volatile memories is avoided so long as the battery is sufficiently charged and engaged. In another embodiment, a charge threshold is at least sufficient that the battery charged at the charge threshold would be sufficiently charged; wherein the battery is adapted to have its charge determined and if the battery charge is less than the charge threshold, the device is powered down and the remaining battery charge is utilized to avoid loss of the stored information of the plurality of volatile memories.

In another broad respect, the present invention is directed to a method comprising the steps of executing a read cycle on a dynamic memory responsively to receiving a read instruction and a clock signal; executing a write cycle on the dynamic memory responsively to receiving a write instruction and the clock signal; executing a refresh cycle, thereby refreshing the dynamic memory, responsively to receiving the clock signal, not receiving the read instruction, and not receiving the write instruction; and actuating the clock signal asynchronously sufficiently frequently such that the dynamic memory does not lose its stored information.

In another broad respect, the present invention is directed to a method comprising the steps of evaluating relatedness of information to be allocated for storage among a plurality of volatile memories and storing the information among the plurality of volatile memories such that related information tends to be stored on a minimal number of the volatile memories, whereby dynamic memory reads and writes tend to cluster among the plurality of volatile memories, thereby tending to leave a greater number of the plurality of volatile memories free from reads and writes than would tend to result from random allocation of information for storage among the plurality of volatile memories.

In another broad respect, the present invention is directed to a method comprising the steps of: testing a dynamic memory to empirically determine a minimum refresh rate, wherein information stored on the dynamic memory will not be lost if and only if the dynamic memory is refreshed at a refresh rate of at least the determined minimum refresh rate; executing a refresh cycle, thereby refreshing the dynamic memory, responsively to receiving the clock signal; and actuating the clock signal sufficiently frequently such that the dynamic memory is refreshed at a refresh rate of at least the minimum determined refresh rate. In other embodiments, the step of actuating the clock signal sufficiently frequently such that the dynamic memory is refreshed at a refresh rate of at least the determined minimum refresh rate comprises actuating the clock signal sufficiently frequently such that the dynamic memory is refreshed at a refresh rate of approximately the determined minimum refresh rate so long as the dynamic memory is in an inactive mode. In another embodiment, the step of testing the dynamic memory to empirically determine the minimum refresh rate comprises testing the dynamic memory to empirically determine the minimum refresh rate with respect to a normal operating temperature range.

In another embodiment, the method further comprises the steps of executing a read cycle on a dynamic memory responsively to receiving a read instruction and a clock signal; executing a write cycle on the dynamic memory responsively to receiving a write instruction and the clock signal, wherein executing a refresh cycle, to refresh the dynamic memory responsively to receiving the clock signal comprises the step of executing a refresh cycle, to refresh the dynamic memory responsively to receiving the clock signal in the absence of the read instruction and absence of the write instruction; and actuating the clock signal asynchronously sufficiently frequently such that the dynamic memory does not lose its stored information.

In another broad respect, the present invention is directed to a method comprising the steps of executing a read cycle on one of a plurality of dynamic memories responsively to receiving a read instruction and a clock signal; executing a write cycle on one of the plurality of dynamic memories responsively to receiving a write instruction and the clock signal; executing a refresh cycle, thereby refreshing at least one of the plurality of dynamic memories, responsively to receiving the clock signal, not receiving the read instruction, and not receiving the write instruction; evaluating relatedness of information to be allocated for storage among the plurality of dynamic memories; storing the information among the plurality of dynamic memories such that related information tends to be stored on a minimal number of the dynamic memories; whereby a greater number of the plurality of dynamic memories are free from read locations and write locations than would tend to result from random allocation of information for storage among the plurality of dynamic memories, due to the tendency to cluster read locations and write locations among the plurality of dynamic memories; wherein information stored on the dynamic memory will not be lost if and only if the dynamic memory is refreshed at a refresh rate of at least a minimum refresh rate determined empirically from testing; and actuating the clock signal sufficiently frequently such that the dynamic memory is refreshed at a refresh rate of at least the determined minimum refresh rate. In other embodiments, the method further comprises the step of backing up content of the dynamic memories onto a secondary memory such that the backed up content can subsequently be restored from the secondary memory. In another embodiment, the method further comprises supplying to each dynamic memory a constant voltage. In another embodiment, the method further comprises the step of generating a square wave with a refresh circuit, when at least one of the plurality of dynamic memories is in an inactive mode, providing the clock signal to each dynamic memory in an inactive mode responsively to the square wave such that each dynamic memory in an inactive mode is refreshed sufficiently to avoid loss of stored information. In another embodiment, the method further comprises the step of configuring (using resistor pull-ups and resistor pull-downs) each dynamic memory in an inactive mode to enable dynamic memory to undergo refresh cycles while other components operably connected to the dynamic memory are in a powered down mode. In another embodiment, the method comprises the steps of determining the charge of a first battery and a second battery such that if the first battery contains sufficient charge and is engaged, providing power to execute refresh cycles using the first battery; or if the first battery lacks sufficient charge and the second battery contains sufficient charge and is engaged, providing power to execute refresh cycles using the second battery; or if the first battery is not engaged and the second battery contains sufficient charge and is engaged, providing power to execute refresh cycles using the second battery. In another embodiment, the method further comprises the steps of providing power to execute refresh cycles using a first battery and determining the charge of the first battery, such that if the charge of the first battery falls below a charge threshold which is greater than a sufficient charge to provide power to execute refresh cycles, recharging the first battery. In another embodiment, the method further comprises providing power to execute refresh cycles using a first battery and determining the charge of the first battery; wherein if the charge of the first battery falls below a charge threshold, wherein the charge threshold is greater than a sufficient charge to provide power to execute refresh cycles, powering down the device that uses the dynamic memory and any system operably connected thereto.

BRIEF DESCRIPTION OF THE DRAWINGS

The following drawings form part of the present specification and are included to further demonstrate certain aspects of the present invention. The figures are not necessarily drawn to scale. The invention may be better understood by reference to one or more of these drawings in combination with the detailed description of specific embodiments presented herein.

DETAILED DESCRIPTION OF PREFERRED EMBODIMENTS

Figure 1:
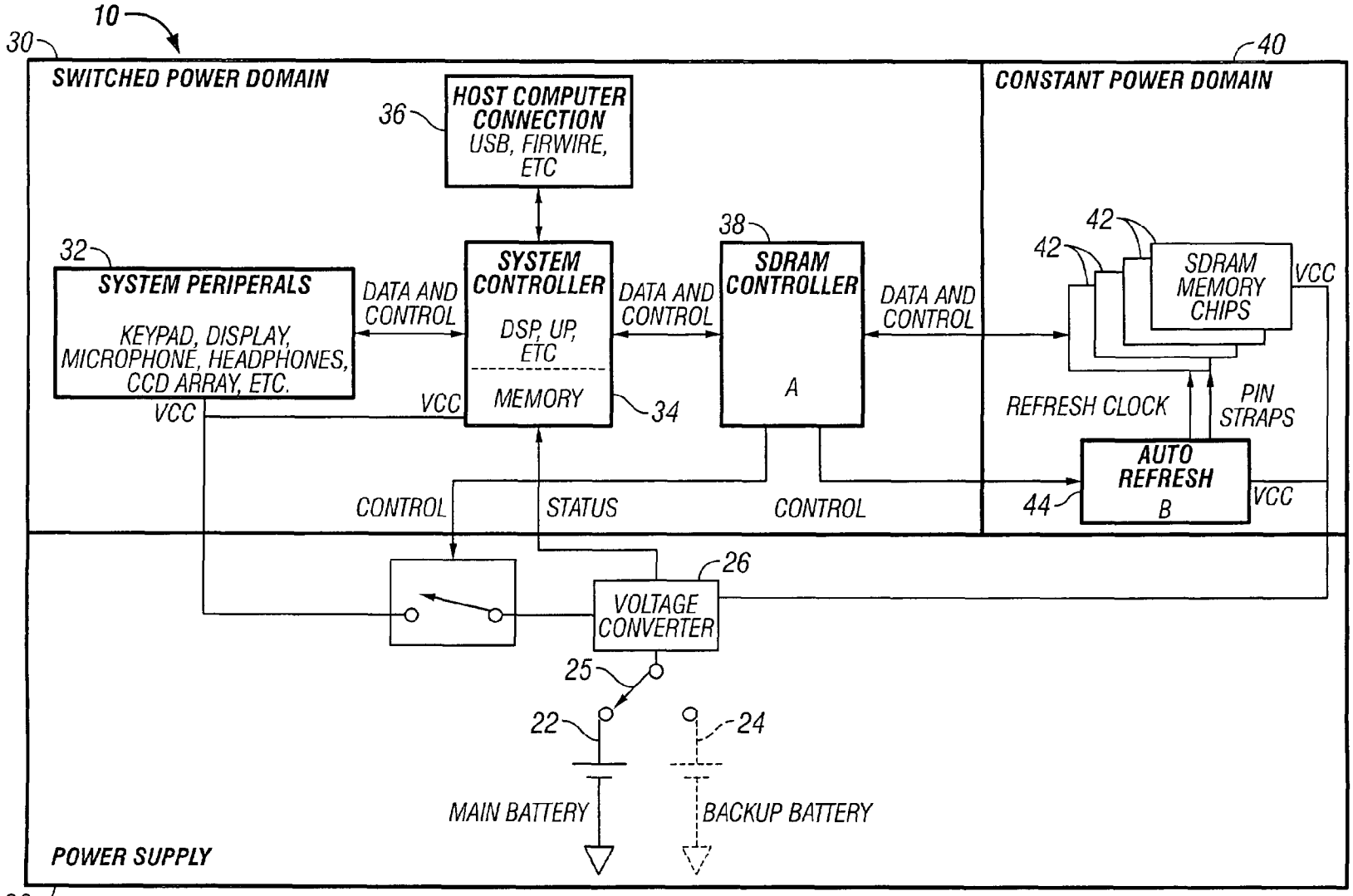
FIG. 1 shows a block diagram of a battery-powered device incorporating SDRAM, in accordance with an embodiment of the present invention.

The present invention solves the shortcomings of previous battery-powered device information storage systems with methods and systems for storing information in volatile memory. The discussion throughout this application of "SDRAM" applies equivalently to other types of dynamic volatile memory.

The use of inexpensive volatile memory for the non-volatile storage of information in battery-powered devices provides the power, size, and reliability advantages of non-volatile memory, but reduces the cost. A cost-effective dynamic memory type currently available is Synchronous Dynamic Random Access Memory (SDRAM). Other types of DRAM are also dynamic, and the scope of the present invention, as claimed, is not limited to any particular type of volatile memory. Due to the use of SDRAM memory chips in personal computers, this memory type is available in high volumes at low cost. In order for SDRAM to be considered a viable replacement for non-volatile memory systems such as flash memory, SDRAM memory must have information storage integrity as reliable as flash memory. However, since SDRAM memory is a volatile memory, stored information is lost when power is removed. Additionally, since SDRAM is a dynamic memory, it must be refreshed periodically to maintain the integrity and reliability of the stored information. Using volatile memory with current operating parameters has been unsuccessful because the processes used by the battery-powered device consume power at a maximum level. By utilizing unique features to reduce the power consumption rate for certain processes used by the device, the present invention is able to extend the battery life while maintaining reliable information in SDRAM memory.

The term "active mode" is used in this document to refer to a memory chip state in which the memory chip is accessed to perform read, write, and refresh cycles. The term "inactive mode" is used in this document to refer to a memory chip state in which information stored on the chip is refreshed, but read and write operations are not performed. In addition, the term "powered down," when used to describe a memory chip is used in this document to refer to the state of a memory chip on which no information is stored, and power may still be supplied but no read, write, or refresh operations occur.

The terms "power up" and "power down," when used to describe a device, are used in this document to refer to the state of the device. The term "powered down" generally means power is supplied only to the elements necessary to reliably store information in volatile memory. Therefore, it is possible for a device to be in a powered up or powered down state independent of whether a memory chip is in an active, inactive, or powered down state.

Battery life is dependent on the power consumption rate. With respect to reducing the power consumption rate, the battery life is related to the current consumption, and the current consumption for a battery-powered device may be approximated by the equation $$I_{total}=I_{static}+I_{dynamic},$$

where $I_{total}$ is the total current consumption, $I_{static}$ is the current consumption when power is applied to the chip with no other operations occurring, and $I_{dynamic}$ includes current consumed for all accesses (read, write, and refresh cycles) and is proportional to $fV_{CC}$, where f is the frequency of accesses, and $V_{CC}$ is the battery voltage.

In battery-powered devices using SDRAM technology, $I_{static}$ is generally used to refer to the current consumption when power is applied to the chip with no other operations occurring. $I_{static}$ is determined by the internal state of the chip and power supply voltage only. One advantage of SDRAM technology is the internal architecture of SDRAM chips allows reduced supply voltage to be provided to the chip resulting in very low static current consumption (typically $I_{static}<200\ \mu A$ per chip).

The rate at which refresh cycles occur (the refresh rate) affects power consumption when the device is in power down modes. In embodiments of the present invention, the refresh rate to maintain memory in the SDRAM chips used when the device is in power down modes is reduced to a minimal refresh rate at a reduced supply voltage. In a preferred embodiment, once the battery-powered device is in a power down mode, power is used only to maintain memory, so the refresh rate is reduced to the lowest level possible based on the memory requirements. Resistor pullups and pull downs are used in the memory configuration to enable the refresh cycles to occur while the remainder of the battery-powered device remains in a power down mode.

The term $fV_{CC}^2$ is used to generally refer to the power used by a chip in an active mode, and in particular, to the power required to perform read, write, and refresh cycle operations. By reducing the supply voltage $V_{CC}$ to the SDRAM chips during active modes, the total power consumption is reduced by a squared amount. Further by reducing the frequency of accesses to the SDRAM chips during active modes, the total power consumption is additionally reduced by a proportional amount. The term "frequency of accesses" refers to the product of the number of times read, write, and refresh cycle operations are performed multiplied by the number of SDRAM chips affected by the read, write, and refresh cycle operations, during an active mode. There may be more than one active mode. For example, if a battery-powered device is temporarily connected to an electrical outlet in a house supplying constant power, the SDRAM chips may be able to operate in a high-speed download mode, whereas if the SDRAM chips are powered only by battery, the SDRAM chips may only be capable of operating in a low-speed (but more energy efficient) download mode.

To increase life of the battery during active modes, the power usage rate is decreased by using chip partitioning during write operations, and the refresh rate is maintained at a minimal rate necessary to maintain memory. Chip partitioning generally involves storing related pieces of information on the same chip to the greatest extent possible. By keeping related information on the same chip (as opposed to random placement of information), the number of chips that contain information is also minimized. As the number of chips with information decreases, the number of chips in an active mode also decreases, therefore the power used for active mode operations also decreases. Additionally, the refresh rate is maintained at a minimal rate during active modes. It should be noted that the minimal refresh rate during an active mode may or may not be the same as a minimal refresh rate for other active modes or for an inactive mode. For example, in some embodiments, the minimal refresh rate for an active mode is higher than the minimal refresh rate for an inactive mode because the write and read functions performed by the system controller interrupt the refresh cycles.

In addition to minimizing the refresh rates for both active and inactive modes, embodiments of the present invention may automatically power down the device if the power supply level provided by the battery drops below a specified threshold. If this occurs, the remaining power is used to maintain memory functions until the battery is replaced or recharged. In a preferred embodiment, whenever the battery-powered device is in a powered up mode, a system controller is constantly monitoring the power level to determine when to power down the battery-powered device. When the system controller determines the power level has dropped below a threshold, all elements necessary to maintain information are configured for a power down mode, and all elements unnecessary to maintain information are powered down. Unique features of the present invention are described in greater detail in the discussion of the figures.

With respect to FIG. 1, one embodiment of the present invention is shown that utilizes SDRAM technology to provide reliable memory using volatile memory devices. FIG. 1 is a block diagram of a battery powered device 10 comprising a power supply 20, including a main battery 22, a backup battery 24, and a voltage converter 26; a switched power domain 30 including system peripherals 32, a system controller 34, a host computer connection 36, and a SDRAM controller 38; and a constant power domain 40, including SDRAM memory chips 42 and an auto-refresh clock controller 44.

Power to the battery-powered system 10 is provided by either main battery 22 or backup battery 24, depending on the position of switch 25. For purposes of this document, the term "battery" is used to mean one or more batteries. If more than one battery is used, it will be apparent to those skilled in the art that the batteries may be connected in series or parallel. Backup battery 24 is used to maintain power supply to the constant power domain 40 when main battery 22 is replaced, or any other short-term power supply is needed. In an alternate embodiment (not shown), main battery 22 is a rechargeable-type battery and backup battery 24 is not installed. In such an embodiment, the power supply used to recharge main battery 22 is further used to provide power to constant power domain 40. Power switch 25 may be mechanical or solid state without departing in scope from the present invention. In some embodiments (not shown) used in cars, the battery-powered device 10 may derive constant power from the constant 12V battery supply and main battery supply from the ignition switched 12V supply.

Switched power domain 30 contains a system controller 34, system peripherals 32, a host computer connection 36, and an SDRAM controller 38, all of whose power requirements are considered secondary to the power requirements of the constant power domain 40.

The system controller 34 interacts with all elements in the switched power domain 30 to operate battery-powered device 10. As part of its processes, system controller 34 determines when elements not located in the constant power domain 40 must be powered down. If the system controller 34 determines the power level to be too low to maintain the current in the battery-powered device 10, all elements in the switched power domain 30 are switched to a powered down or inactive mode until the power level rises above the threshold. When the device is in a powered up mode, the system controller 34 generates an asynchronous clock signal to issue read, write, and refresh cycle instructions. The system controller 34 issues the clock signals required for each instruction and does not issue clock signals when the device 10 is in a powered down mode. The system controller 34 issues refresh cycle instructions at a minimal rate, similar to the method used to refresh SDRAM memory chips 42 when device 10 is in a powered down mode. The refresh cycle instructions may be issued periodically or in bursts or groups, such that each internal row of SDRAM memory is refreshed to avoid memory loss.

The system peripherals 32 may include without limitation any device for interacting with battery-powered device 10, including a keypad, display, microphone, headphones, or a CCD array.

The host computer connection 36 connects the battery-powered device 10 to a host computer to download files, music, or other information. Host computer connection 36 may be USB, Firewire, or any other connection without departing in scope from the present invention. The host computer (not shown) may also be used as a backup system. In some embodiments, the host computer saves a copy of the information downloaded to battery-powered device 10, so that the contents of SDRAM memory chips 42 may be recovered in the event of power loss in the battery-powered device 10.

SDRAM controller 38 controls the interface to the SDRAM chips 42 during active modes. SDRAM controller 38 issues read, write, and refresh cycle instructions as requested by the system controller 34. In some embodiments, SDRAM controller 38 issues read, write, and refresh cycle instructions using an asynchronous clocking scheme. SDRAM controller 38 also controls the active mode chip partitioning for storage of information. Although SDRAM controller 38 and system controller 34 are shown as separate elements, all or portions of SDRAM controller 38 may be implemented in software depending on the capabilities of system controller 34. In the event that the power level drops below a specified threshold, SDRAM controller 38 may configure SDRAM memory chips 42 for auto-refresh cycle operations before system controller 34 powers down the switched power domain 30.

Constant power domain 40 contains one or more SDRAM memory chips 42 and auto-refresh clock controller, also referred to as a refresh circuit, 44. Auto-refresh clock controller 44 controls SDRAM memory chips 42 during periods in which switched power domain elements are powered down. In some embodiments, auto-refresh clock controller 44 may configure the one or more SDRAM memory chips 42 for auto-refresh commands using pin straps and may issue clock signals to initiate refresh cycles. In a preferred embodiment, the clock signal rate and the refresh rate during device powered down states are constant and the clock is enabled/disabled by the SDRAM controller 38. However, the clock signal rate may be adjustable so that the minimal refresh rate may be determined for each battery-powered device 10. In device powered up states in some embodiments, the clock signal is non-periodic or may be supplied only when read, write, or refresh cycle operations are required. A non-periodic clock signal enables the minimum number of clock signals to be issued, resulting in minimal power consumption. In a preferred embodiment, the active mode configuration of the digital clock is asynchronous, non-periodic, and supplied to the SDRAM memory chips 42 only when read, write, or refresh cycle instructions are supplied to the system controller 34. In this embodiment, active power consumption is reduced by reducing the number of times the memory chips 42 are accessed.

The present invention uses unique features to maintain memory in SDRAM memory chips 42 during device powered down modes. SDRAM manufacturers generally provide two methods for maintaining memory in SDRAM memory: self-refresh and auto-refresh. In self-refresh, the SDRAM memory chip issues refresh cycle instructions to each internal row of memory in the device at a specified time interval or periodic rate. The self-refresh mode does not require information from outside the SDRAM chip to maintain information. In auto-refresh mode the SDRAM chip 42 relies on the external logic to issue the refresh cycles at a rate that is sufficient to maintain the information. Although self-refresh is simple to use the refresh rate at which it refreshes the internal memory is well above the minimal rate required to maintain the information when the chip is not being used. When the battery-powered device 10 is powered down but SDRAM must be maintained, the use of self-refresh would consume too much power for reasonable battery life. However, in the auto-refresh mode in some embodiments of the present invention, the refresh rate can be reduced by a factor of 1000 or more resulting in a corresponding reduction in power consumption.

The minimum refresh rate for the SDRAM memory chips 42 may be determined from test data generated for each manufacturer's SDRAM memory chips 42. For example, information may be downloaded to SDRAM memory chips 42 and refreshed at successively lower refresh rates. For each successively lower refresh rate, the information is tested for errors. This process may be repeated for multiple chips 42 over multiple temperature ranges to determine a minimum refresh range for a normal operating temperature range. The actual refresh rate may be higher by a specified safety factor to provide a reliable refresh rate. The refresh rate determination process may be repeated for each battery-powered device 10 to provide an even higher reliability for the information. Theoretical and test data shows that a refresh rate maintained at or above a minimum refresh rate does not result in information loss over a normal operating temperature range.

Since auto-refresh is employed while the device 10 is powered down, a refresh circuit 44 that is capable of issuing the required refresh cycles remains powered up along with the SDRAM memory chips 42. The SDRAM memory chips 42 perform an auto-refresh cycle when their input pins are properly configured and a clock signal is issued. Since the other logic in the battery-powered device 10 is powered down or in an inactive mode, the SDRAM pins are not being driven. Therefore, the pins can be configured using resistor pin straps. The refresh circuit 44 must also generate a clock signal for the SDRAM memory chips 42. The clock signal may be generated using a square wave generator. The square wave generator can be designed to generate a fixed or programmable frequency. Since the power consumed by the refresh circuit is also proportional to the frequency, the refresh circuit consumes very little power during inactive modes. During active modes, the refresh circuit is disabled and the system controller 34 (DSP) issues refresh cycles. On the transition from active modes to inactive modes the system controller 34 configures the SDRAM memory chips 42 to accept refresh cycles and then re-enables the refresh circuit.

Figure 2:
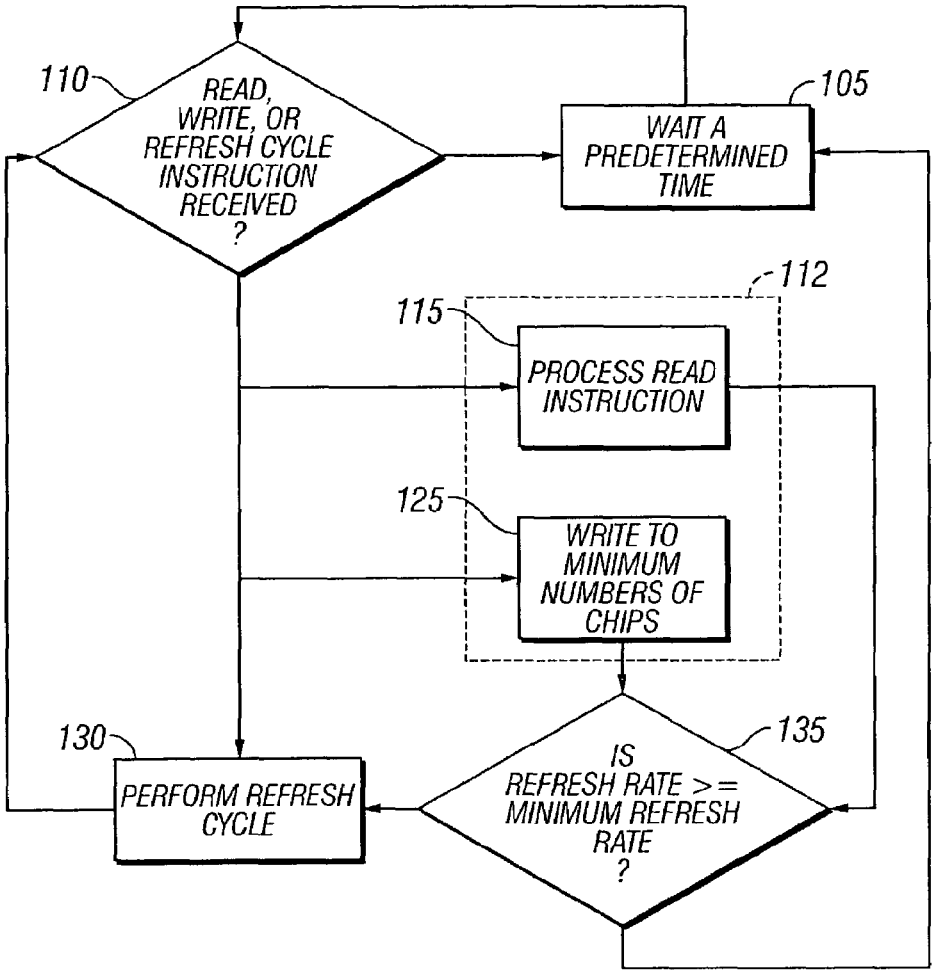
FIG. 2 shows a process flow for exploiting dynamic memory to minimize device power usage, in accordance with an embodiment of the present invention.

Now with respect to FIG. 2, a method is described for managing the power used by one embodiment of the present invention is described in greater detail.

In step 110, the system controller 34 determines if a read instruction, a write instruction, or a refresh instruction has been received. If no instruction is received, the present invention waits in an inactive status 105 for a period of time before checking again for a read, write or refresh instruction 110.

In the event that a read instruction has been received, the present invention switches to an active mode 112 and performs the functions dictated by the read instruction 115. Once the read instruction has been processed by the present invention, the system controller 34 determines in step 135 whether the memory has been refreshed at a rate of at least the determined minimum refresh rate. If not, then in step 130, the memory is refreshed. Once the memory is refreshed, the system controller 34 checks for another read, write, or refresh cycle instruction 110.

Similar to the process followed by the system controller 34 in response to a read instruction, a write instruction received by the system controller 34 triggers the system to move from an inactive mode to an active mode 112 to perform the write functions dictated by the write instruction 125. Once the write instruction has been processed by the present invention, the system controller 34 determines in step 135 whether the memory has been refreshed at a rate of at least the determined minimum refresh rate. If not, then in step 130, the memory is refreshed. Once the memory is refreshed, the system controller 34 checks for another read, write, or refresh cycle instruction 110.

In step 110, the instruction received by the system controller 34 may also be a refresh instruction. In this situation, the system controller 34 performs a refresh cycle 130. Once the refresh cycle is completed, the system controller 34 checks for another read, write, or refresh cycle instruction 110.

Figure 3:
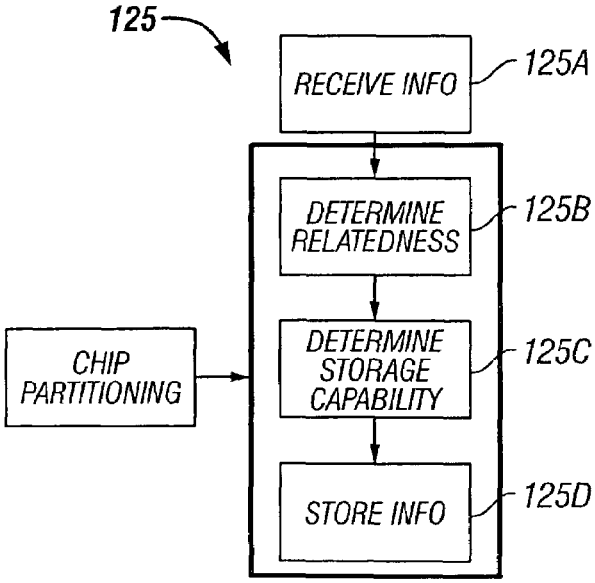
FIG. 3 shows a memory partitioning process, in accordance with an embodiment of the present invention.

As part of completing a write operation in step 125, the SDRAM controller 38 performs several functions collectively referred to as chip partitioning. Chip partitioning tends to reduce the number of chips on which information is stored, effectively reducing the power consumption rate. Turning to FIG. 3, as information is received by the SDRAM controller 38 in step 125A, the SDRAM controller 38 determines the relatedness of the various pieces of information in step 125B. Chip partitioning provides a tendency to store related pieces of information on the same chip to the greatest extent possible. Also, the storage capacity of the SDRAM memory 42 is determined in step 125C to find the optimum storage configuration. Factors that may be included in the determination of storage capacity include SDRAM memory configuration, and size of an SDRAM chip 42. Determining the storage capacity of the SDRAM memory 42 may also include determining the minimum number of chips necessary to store all the information received by the SDRAM controller 38. Once the necessary information is determined, the information is stored in step 125D on the minimum number of SDRAM chips 42. Chip partitioning results in fewer SDRAM memory chips being maintained in an active state, thereby reducing the power consumption for the system.

As used throughout this application, the term "battery-powered devices" includes devices requiring low power consumption, whether or not actually powered by batteries.

Any element in a claim that does not explicitly state "means for" performing a specified function, or "step for" performing a specific function, is not to be interpreted as a "means" or "step" clause as specified in 35 U.S.C. § 112, ¶ 6. In particular, the use of "step of" in the claims herein is not intended to invoke the provision of 35 U.S.C. § 112, ¶ 6.

It should be apparent from the foregoing that an invention having significant advantages has been provided. While the invention is shown in only a few of its forms, it is not just limited to those forms but is susceptible to various changes and modifications without departing from the spirit thereof. Any references cited in this document are incorporated by reference to the maximum extent allowable by law. To the extent a reference may not be fully incorporated herein, it is incorporated by reference for background purposes and indicative of the knowledge of one of ordinary skill in the art.

What is claimed is:

[1. A device comprising:

a synchronous dynamic memory;

a clock signal supplied externally to the dynamic memory;

wherein the dynamic memory is refreshed at a determined minimum refresh rate to avoid loss of its stored information;

wherein the dynamic memory is adapted to undergo read, write, and refresh cycles responsively to the clock signal; and wherein the clock signal to the dynamic memory, in power up mode, only when needed for a read, write, or refresh of the dynamic memory.]

2. A device comprising:

a plurality of synchronous dynamic memories, [wherein each dynamic memory is refreshed at a determined minimum refresh rate to avoid loss of associated stored information, and] wherein each dynamic memory is adapted to be used in one of at least two device modes, the device modes including (a) power up mode and (b) power down mode*, and wherein each dynamic memory is further adapted to receive a clock signal from an external source; and*

*a controller configured to refresh each dynamic memory at a determined minimum refresh rate that is lower than a self-refresh rate of the plurality of synchronous dynamic memories;*

[and a clock signal supplied externally to the dynamic memories;]

wherein each dynamic memory is adapted to undergo read, write, and refresh cycles [responsively to the clock signal];

wherein one of the dynamic memories [undergoing] *is configured to undergo* a read or write cycle [is] *when* in the power up mode;

[wherein information is allocated among the dynamic memories to predispose the storage of related information on one of the dynamic memories;]

wherein *the clock circuitry is configured to supply* the clock signal [is supplied] to the dynamic memories only when needed for a read or a write, and at least at the determined refresh rate of the dynamic memories; and whereby other dynamic memories are *configured to be* in the power down mode while said one of the dynamic memories is in the power up mode.

[3. A device comprising:

a processor;

a plurality of synchronous dynamic memories;

a clock signal supplied externally to the dynamic memories;

wherein each dynamic memory is adapted to store information;

wherein each dynamic memory is refreshed at a determined minimum refresh rate to avoid loss of its stored information;

wherein each dynamic memory is adapted to be used in one of at least two device modes, the device modes including (a) power up mode and (b) power down mode;

wherein each dynamic memory is adapted to undergo read, write, and refresh cycles responsively to the clock signal;

wherein one of the dynamic memories undergoing a read or write cycle is in the power up mode;

wherein the processor allocates storage of information among the dynamic memories to create a tendency for related information to be stored on the said one of the dynamic memories to the extent possible, whereby other dynamic memories are in the power down mode while said one of the dynamic memories is in the power up mode;

wherein the clock signal is supplied to the dynamic memories only when needed for a read or a write, and at the minimum refresh rate of the dynamic memories;

and wherein the processor determines the minimum refresh rate for each dynamic memory.]

4. The device according to [claim 3] *claim 2*, further comprising:

a computing device including a secondary memory;

wherein each dynamic memory is adapted to be in communication with the secondary memory;

such that the stored information of each dynamic memory can be backed up on the secondary memory; and such that backed up information on the secondary memory can be restored from the secondary memory.

5. The device according to [claim 3] *claim 2*, wherein a constant voltage is supplied to each dynamic memory.

6. The device according to [claim 3] *claim 2*, [further comprising:

a refresh circuit;]

wherein the refresh circuit generates a square wave; and wherein, when the dynamic memory is used in a device power down mode, the clock signal is responsive to the refresh circuit's square wave.

7. The device according to claim 6, further comprising:

resistor pull-ups;

resister pull-downs; and wherein the resistor pull-ups and resistor pull-downs are configured to enable the dynamic memory to undergo refresh cycles while the remainder of the device is in a powered down mode.

8. The device according to [claim 3] *claim 2*, further comprising:

a first battery;

a second battery;

wherein the first battery is adapted to provide sufficient power to enable each of the plurality of dynamic memories to undergo refresh cycles;

wherein the second battery is adapted to provide sufficient power to enable each of the plurality of dynamic memories to undergo refresh cycles; and wherein loss of the stored information of each of the plurality of dynamic memories is avoided so long as at least one of the batteries is sufficiently charged and engaged.

9. The device according to [claim 3] *claim 2*, further comprising:

a battery;

wherein the battery is adapted to provide, when sufficiently charged and engaged, sufficient power to enable each of the plurality of dynamic memories to undergo refresh cycles;

wherein the battery is adapted to be recharged to be at least sufficiently charged; and whereby loss of the stored information of each of the dynamic memories is avoided so long as the battery is sufficiently charged and engaged.

10. The device according to claim 9, wherein a charge threshold is at least sufficient that the battery charged at the charge threshold would be sufficiently charged;

wherein the battery is adapted to have its charge determined;

wherein, if the battery charge is less than the charge threshold, the device is powered down; and wherein the remaining battery charge is utilized to avoid loss of the stored information of the plurality of dynamic memories.

11. A method for refreshing a synchronous dynamic memory [in a powerup mode], the method comprising:

executing a read cycle on the dynamic memory responsively to receiving a read instruction and a clock signal;

executing a write cycle on the dynamic memory responsively to receiving a write instruction and the clock signal;

executing a refresh cycle, at a [determined] minimum refresh rate [thereby refreshing] *to refresh* the dynamic memory, [responsively] *wherein the determined minimum refresh rate is less than a self-refresh rate of the synchronous dynamic memory, wherein said executing is responsive* to [receiving the clock signal,] not receiving a read instruction, and not receiving a write instruction; and actuating the clock signal only when executing a read, write or refresh cycle, [and] such that the dynamic memory does not lose its stored information.

[12. A device comprising:

a synchronous dynamic memory;

a clock signal supplied externally to the dynamic memory;

wherein the dynamic memory is refreshed at a determined minimum refresh rate to avoid loss of its stored information;

wherein the dynamic memory is adapted to undergo refresh cycles responsively to the clock signal; and wherein the clock signal is supplied to the dynamic memory, in a power-down mode, at least at the determined minimum refresh rate.]

13. A method for refreshing a synchronous dynamic memory in a power-down mode, the method comprising:

determining a minimum refresh rate at which the dynamic memory must be refreshed *at* to avoid loss of its stored information*, wherein the minimum refresh rate is less than a self-refresh rate of the synchronous dynamic memory*;

supplying a clock signal externally to the dynamic memory at least at the determined minimum refresh rate; and executing a refresh cycle, thereby refreshing the dynamic memory, responsively to receiving the clock signal.

*14. An apparatus, comprising:*

*a memory requiring refresh operations to prevent loss of stored data;*

*a power source configured to provide power for the refresh operations and access operations of the memory; and*

*a controller external from and coupled to the memory and that is configured to:*

*periodically issue refresh commands to refresh the memory at a determined minimum refresh rate, wherein the determined minimum refresh rate is lower than a self-refresh rate of the memory, and wherein the determined minimum refresh rate is selected to prevent loss of data,*

*issue non-periodic access commands to the memory, and*

*issue clock signals to the memory only along with the periodic refresh commands and the non-periodic access commands.*

*15. The apparatus of claim 14, further comprising a refresh circuit configured to issue refresh signals to the memory at the refresh rate, and wherein the controller is further configured to detect a low-power level condition of the power source and to activate the refresh circuit in response to the low-power level condition.*

*16. The apparatus of claim 15, wherein the memory is a synchronous dynamic random access memory (SDRAM) configured to operate in an auto-refresh mode, and wherein the refresh signals are clock signals.*

*17. The apparatus of claim 16, further comprising resistor pin straps coupled to pins of the SDRAM, and wherein the controller is configured to set the resistor pin straps to configure the SDRAM for the auto-refresh mode.*

*18. The apparatus of claim 15, wherein the controller is further configured to reserve power to the refresh circuit and to the memory in response to the low-power level condition to maintain the stored data.*

*19. The apparatus of claim 18, wherein the memory comprises multiple memory chips, and wherein the controller is further configured to:*

*receive data to be written to the memory; and*

*write the received data to as few of the memory chips as necessary to store the received data.*

*20. The apparatus of claim 14, wherein the memory comprises multiple memory chips, and wherein the controller is further configured to:*

*place at least one of the memory chips into an inactive state requiring a reduced power level compared to an active state; and*

*maintain at least another one of the remaining memory chips in the active state.*

*21. The apparatus of claim 14, wherein the power source comprises a battery.*

*22. The apparatus of claim 14, wherein the power source comprises two batteries, wherein both batteries are independently sufficient to power the memory to maintain the stored data.*

*23. A method, comprising:*

*powering, by one or more batteries, a synchronous dynamic random access memory (SDRAM) of an apparatus;*

*issuing, by a controller that is external to the SDRAM, non-periodic access commands to the SDRAM;*

*periodically issuing, by the controller, refresh commands to periodically refresh the SDRAM at a determining minimum refresh rate that is lower than a self-refresh-mode refresh rate of the SDRAM; and*

*only issuing, by the controller, clock signals with the issued refresh operations and issued access commands.*

*24. The method of claim 23, further comprising:*

*determining, by the controller, that an available power level of the one or more batteries is lower than a predetermined minimum power level;*

*in response to said determining, activating by the controller a refresh circuit to issue periodic clock signals at the reduced refresh rate to maintain data stored on the SDRAM; and*

*in response to said determining, disabling, by the controller, all components of the apparatus other than the SDRAM and the refresh circuit.*

*25. The method of claim 23, wherein the SDRAM further comprises multiple SDRAM chips, wherein the method further comprises placing, by the controller, at least one of the SDRAM chips into an inactive mode requiring less power than an active mode and maintaining at least one other SDRAM chip in the active mode.*

*26. The method of claim 23, wherein the access commands comprise at least one write command to write received data to the SDRAM, wherein the SDRAM comprises a plurality of SDRAM chips, and wherein the method further comprises determining relatedness of the received data and writing related data to one of the plurality of the SDRAM chips.*

* * * * *

UNITED STATES PATENT AND TRADEMARK OFFICE

CERTIFICATE OF CORRECTION

PATENT NO. : RE43,223 E
APPLICATION NO. : 12/108221
DATED : March 6, 2012
INVENTOR(S) : Stimak et al.

It is certified that error appears in the above-identified patent and that said Letters Patent is hereby corrected as shown below:

Title page, item (56), under "Other Publications", in Column 2, Line 4, delete "Greec," and insert -- Greece, --.

Title page, item (57), under "Abstract", in Column 2, Line 7, delete "battery powered" and insert -- battery-powered --.

Column 11, line 51, in Claim 1, delete "wherein the clock signal to the dynamic memory, in power" and insert -- wherein the clock signal is supplied to the dynamic memory, in a power --.

Column 12, lines 12-13, in Claim 2, delete "wherein *the clock circuitry is configured to supply* the clock signal [is supplied] to" and insert -- wherein the clock signal is supplied to --.

Column 12, lines 46-47, in Claim 3, delete "and at the minimum refresh rate of the dynamic memories;" and insert -- and at the determined minimum refresh rate of the dynamic memories; --.

Column 12, lines 61-64, in Claim 6, delete "*claim 2*, [further comprising: a refresh circuit;] wherein" and insert -- *claim 2*, further comprising: a refresh circuit; wherein --.

Column 13, line 44, in Claim 11, delete "memory [in a powerup mode], the" and insert -- memory in a powerup mode, the --.

Column 13, line 50, in Claim 11, delete "a [determined] minimum" and insert -- a determined minimum --.

Column 15, line 8, in Claim 23, delete "*determining*" and insert -- *determined* --.

Signed and Sealed this
Eighteenth Day of September, 2012

David J. Kappos

David J. Kappos
*Director of the United States Patent and Trademark Office*